United States Patent
Liu et al.

(10) Patent No.: US 12,253,586 B2
(45) Date of Patent: Mar. 18, 2025

(54) SYSTEMS AND METHODS FOR MAGNETIC RESONANCE IMAGING

(71) Applicant: UNITED IMAGING HEALTHCARE NORTH AMERICA, INC., Houston, TX (US)

(72) Inventors: Qi Liu, Houston, TX (US); Jian Xu, Houston, TX (US)

(73) Assignee: UNITED IMAGING HEALTHCARE NORTH AMERICA, INC., Houston, TX (US)

(*) Notice: Subject to any disclaimer, the term of this patent is extended or adjusted under 35 U.S.C. 154(b) by 69 days.

(21) Appl. No.: 18/298,394

(22) Filed: Apr. 11, 2023

(65) Prior Publication Data

US 2024/0345193 A1     Oct. 17, 2024

(51) Int. Cl.
*G01R 33/48* (2006.01)
*G01R 33/567* (2006.01)

(52) U.S. Cl.
CPC ..... *G01R 33/4826* (2013.01); *G01R 33/5676* (2013.01)

(58) Field of Classification Search
CPC .............. G01R 33/4826; G01R 33/5676
See application file for complete search history.

(56) References Cited

U.S. PATENT DOCUMENTS

| | | | |
|---|---|---|---|
| 10,436,871 B2 | 10/2019 | Li et al. | |
| 2015/0050218 A1* | 2/2015 | Giavazzi | G01R 33/5601 424/9.3 |
| 2016/0313433 A1* | 10/2016 | Beck | G01R 33/56509 |
| 2022/0369948 A1 | 11/2022 | Liu et al. | |

FOREIGN PATENT DOCUMENTS

| | | |
|---|---|---|
| CN | 104111431 A | 10/2014 |
| WO | 2021257742 A1 | 12/2021 |

OTHER PUBLICATIONS

Liang, Zhi-Pei, Spatiotemporal Imaging with Partially Separable Functions, 2007 4th IEEE International Symposium on Biomedical Imaging, 988-991, 2007.
Anthony G. Christodoulou et al., Magnetic Resonance Multitasking for Motion-Resolved Quantitative Cardiovascular Imaging, Nature Biomedical Engineering, 2018, 12 pages.
(Continued)

*Primary Examiner* — G. M. A. Hyder
(74) *Attorney, Agent, or Firm* — METIS IP LLC

(57) ABSTRACT

An MRI method and system may be provided. A plurality of sets of k-space data of a region of interest (ROI) of a subject may be obtained. Each of the plurality of sets of k-space data may be collected during one of a plurality of acquisition periods after an MR sequence is applied on the subject. Then, for each of the plurality of sets of k-space data, position information of a reference region during the corresponding acquisition period may be determined based on the set of k-space data. The set of k-space data may be corrected based on the position information of the reference region. Further, a dynamic MR image sequence may be generated based on the plurality sets of corrected k-space data.

20 Claims, 5 Drawing Sheets

(56) References Cited

OTHER PUBLICATIONS

Wang, Nan et al., Six-Dimensional Quantitative DCE MR Multitasking of the Entire Abdomen: Method and Application to Pancreatic Ductal Adenocarcinoma, Magnetic Resonance in Medicine, 1-15, 2020.

Li, Feng et al., XD-GRASP: Golden-Angle Radial MRI with Reconstruction of Extra Motion-State Dimensions Using Compressed Sensing, Magnetic Resonance in Medicine, 75: 775-788, 2016.

Li, Feng et al., GRASP-Pro: Improving GRASP DCE-MRI through Self-Calibrating Subspace-Modeling and Contrast Phase Automation, Magnetic Resonance in Medicine, 1-15, 2019.

\* cited by examiner

400

| Determining, based on a first angle between a motion direction of the physiological motion and a readout direction of the navigator data, a first motion component of the physiological motion in the readout direction of the navigator data and a second motion component of the physiological motion in a direction perpendicular to the readout direction of the navigator data | 410 |

| Correcting the navigator data based on the position information of the reference region, the first motion component, and the second motion component | 420 |

FIG. 4

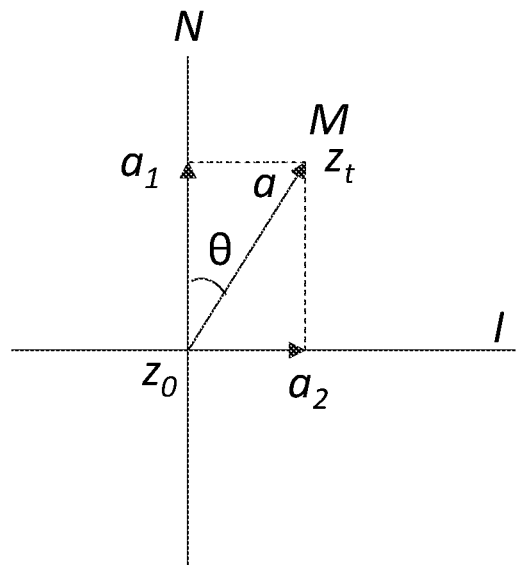

FIG. 5

SYSTEMS AND METHODS FOR MAGNETIC RESONANCE IMAGING

TECHNICAL FIELD

The present disclosure generally relates to magnetic resonance imaging (MRI), and more particularly, methods and systems for dynamic MRI.

BACKGROUND

MRI has been widely used in clinical examination and disease diagnosis in recent years. In particular, dynamic MRI can provide a set of images including rich information over a dynamic scan time, which is beneficial for disease diagnosis. Conventionally, dynamic MRI of some organs or tissues (e.g., a liver, a kidney, etc.) that are affected by physiological motion (e.g., a cardiac motion, a respiratory motion, etc.) has a limited accuracy and efficiency. For example, during a traditional abdominal MRI scan, a subject being scanned usually needs to hold a breath, or the scan needs to be triggered multiple times by monitoring the respiratory status of the subject. The former approach is limited by a duration of the breath-holding time, and the imaging resolution is low. Although the effect of the physiological motion on the latter approach is relatively lower, the scanning efficiency is very low, and the scan is interrupted multiple times in the scanning process. Therefore, it is desirable to provide systems and methods for dynamic MRI with an improved accuracy and efficiency.

SUMMARY

According to an aspect of the present disclosure, an MRI system may be provided. The system may include at least one storage device including a set of instructions and at least one processor. The at least one processor may be configured to communicate with the at least one storage device. When executing the set of instructions, the at least one processor may be configured to direct the system to perform one or more of the following operations. The system may obtain a plurality of sets of k-space data of a region of interest (ROI) of a subject. Each of the plurality of sets of k-space data may be collected during one of a plurality of acquisition periods after an MR sequence is applied on the subject. For each of the plurality of sets of k-space data, the system may also determine position information of a reference region during the corresponding acquisition period based on the set of k-space data, and correct the set of k-space data based on the position information of the reference region. The system may further generate a dynamic MR image sequence based on the plurality sets of corrected k-space data.

In some embodiments, to determine position information of a reference region during the corresponding acquisition period based on the set of k-space data, the system may generate an initial MR image of the ROI based on the set of k-space data. The system may also segment a first region and a second region from the initial MR image. The reference region may be located between the first region and the second region. The system may further determine the position information of the reference region based on the first region and the second region.

In some embodiments, the reference region may be an interface between a lung and a diaphragm of the subject or an interface between the lung and a liver of the subject.

In some embodiments, the set of k-space data may include navigator data, and to correct the set of k-space data based on the position information of the reference region, the system may determine a motion direction of a physiological motion of the subject and a readout direction of the navigator data. The system may also determine a first angle between the motion direction of the physiological motion and the readout direction of the navigator data. The system may further correct the navigator data based on the position information of the reference region and the first angle.

In some embodiments, to correct the navigator data based on the position information of the reference region and the first angle, the system may determine a first motion component of the physiological motion in the readout direction of the navigator data and a second motion component of the physiological motion in a direction perpendicular to the readout direction of the navigator data based on the first angle. The system may further correct the navigator data based on the position information of the reference region, the first motion component, and the second motion component.

In some embodiments, when the first motion component is greater than 0, different points of the navigator data may be corrected based on the first motion component using different first phase correction factors.

In some embodiments, the first phase correction factor of each point of the navigator data may be determined based on a position of the point in k-space and the first motion component.

In some embodiments, when the second motion component is greater than 0, different points of the navigator data may be corrected based on the second motion component using a same second phase correction factor.

In some embodiments, the second phase correction factor may be determined based on the second motion component and information relating to a slab encoding direction of the navigator data.

In some embodiments, the set of k-space data may include imaging data, and to correct the set of k-space data based on the position information of the reference region, the system may determine a motion direction of a physiological motion of the subject and a readout direction of the imaging data. The system may also determine a second angle between the motion direction of the physiological motion and the readout direction of the imaging data. The system may further correct the imaging data based on the position information of the reference region and the second angle.

In some embodiments, to correct the imaging data based on the position information of the reference region and the second angle, the system may determine a third motion component of the physiological motion in the readout direction of the imaging data and a fourth motion component of the physiological motion in a direction perpendicular to the readout direction of the imaging data based on the second angle. The system may correct the imaging data based on the position information of the reference region, the third motion component, and the fourth motion component.

In some embodiments, to generate a dynamic MR image sequence based on the plurality sets of corrected k-space data, the system may divide the plurality sets of corrected k-space data into a plurality of bins based on the position information of the reference region corresponding to the plurality of acquisition periods. The system may also generate an initial matrix including the plurality sets of corrected k-space data based on the plurality of bins and the plurality of acquisition periods. The system may also generate a completion matrix by completing the initial matrix. The system may further generate the dynamic MR image sequence based on the completion matrix.

In some embodiments, to generate a dynamic MR image sequence based on the plurality sets of corrected k-space data, the system may reconstruct a plurality of second initial MR images based on the plurality of sets of corrected k-space data. The system may also generate a plurality of registered MR images corresponding to the plurality of acquisition periods by performing image registration between the plurality of second initial MR images. For each of the plurality of acquisition periods, the system may determine reference navigator data corresponding to the acquisition period based on the registered MR image corresponding to the acquisition period. The system may further generate the dynamic MR image sequence based on the reference navigator data and the registered MR image of each acquisition period.

In some embodiments, for each of the plurality of acquisition periods, the corresponding set of k-space data may include navigator data, and to determine reference navigator data corresponding to the acquisition period based on the registered MR image corresponding to the acquisition period, the system may perform one or more of the following operations. For each of the plurality of acquisition periods, the system may determine a plurality of sectional images perpendicular to a readout direction of the navigator data corresponding to the acquisition period from the registered MR image of the acquisition period. The system may further determine the reference navigator data of the acquisition period based on the plurality of sectional images.

In some embodiments, to determine the reference navigator data of the acquisition period based on the plurality of sectional images, the system may perform one or more of the following operations. For each of the plurality of sectional images, the system may determine a sum of pixel values of pixels in the sectional image. The system may further determine the reference navigator data based on the sum corresponding to each of the plurality of sectional images.

According to another aspect of the present disclosure, an MRI system may be provided. The system may include at least one storage device including a set of instructions and at least one processor. The at least one processor may be configured to communicate with the at least one storage device. When executing the set of instructions, the at least one processor may be configured to direct the system to perform one or more of the following operations. The system may obtain a plurality of initial MR images of a region of interest (ROI) of a subject. Each of the plurality of initial MR images may be reconstructed based on a set of k-space data collected during one of a plurality of acquisition periods after an MR sequence is applied on the subject. The system may generate a plurality of registered MR images corresponding to the plurality of acquisition periods by performing image registration between the plurality of initial MR images. For each of the plurality of acquisition periods, the system may also determine reference navigator data corresponding to the acquisition period based on the registered MR image corresponding to the acquisition period. The system may further generate a dynamic MR image sequence based on the reference navigator data and the registered MR image of each acquisition period.

According to yet another aspect of the present disclosure, an MRI method may be provided. The method may include obtaining a plurality of sets of k-space data of a region of interest (ROI) of a subject. Each of the plurality of sets of k-space data may be collected during one of a plurality of acquisition periods after an MR sequence is applied on the subject. The method may also include, for each of the plurality of sets of k-space data, determining position information of a reference region during the corresponding acquisition period based on the set of k-space data. The method may also include correcting the set of k-space data based on the position information of the reference region. The method may further include generating a dynamic MR image sequence based on the plurality sets of corrected k-space data.

According to yet another aspect of the present disclosure, an MRI method may be provided. The method may include obtaining a plurality of initial magnetic resonance (MR) images of a region of interest (ROI) of a subject. Each of the plurality of initial MR images may be reconstructed based on a set of k-space data collected during one of a plurality of acquisition periods after an MR sequence is applied on the subject. The method may include generating a plurality of registered MR images corresponding to the plurality of acquisition periods by performing image registration between the plurality of initial MR images. The method may also include, for each of the plurality of acquisition periods, determining reference navigator data corresponding to the acquisition period based on the registered MR image corresponding to the acquisition period. The method may further include generating a dynamic MR image sequence based on the reference navigator data and the registered MR image of each acquisition period.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 4 is a flowchart illustrating an exemplary process for correcting navigator data of a subject corresponding to an acquisition period according to some embodiments of the present disclosure;

FIG. 5 is a schematic diagram illustrating a first motion component and a second motion component of a physiological motion corresponding to an acquisition period according to some embodiments of the present disclosure.

DETAILED DESCRIPTION

Figure 1:
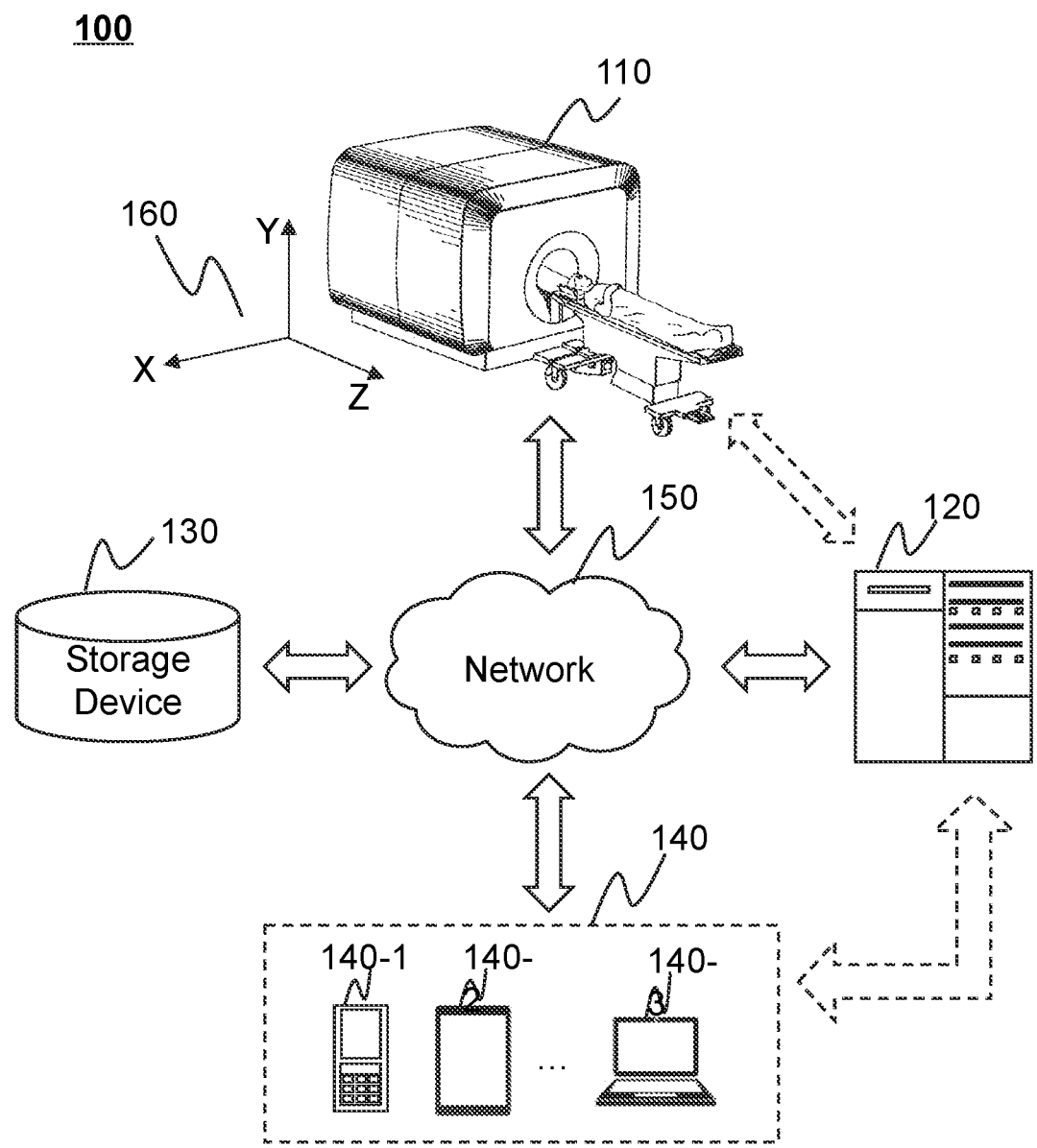
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "device," "unit," "module," and/or "block" used herein are one method to distinguish different components, elements, parts, sections or assemblies of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, a device, or a portion thereof.

It will be understood that when a unit, device, module or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items. The term "pixel" and "voxel" in the present disclosure are used interchangeably to refer to an element in an image. An anatomical structure shown in an image of a subject (e.g., a patient) may correspond to an actual anatomical structure existing in or on the subject's body. For example, a body part shown in an image may correspond to an actual body part existing in or on the subject's body, and a feature point in an image may correspond to an actual physical point existing in or on the subject's body. For the convenience of descriptions, an anatomical structure shown in an image and its corresponding actual anatomical structure are used interchangeably. For example, the chest of the subject refers to the actual chest of the subject or a region representing the chest in an image of the subject. The term "image" in the present disclosure is used to refer to images of various forms, including a 2-dimensional image, a 3-dimensional image, a 4-dimensional image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Moreover, while the systems and methods disclosed in the present disclosure are described primarily regarding dynamic MRI. It should be understood that this is only for illustration purposes. The systems and methods of the present disclosure may be applied to any other kind of medical imaging system. In some embodiments, the imaging system may include a single modality imaging system and/or a multi-modality imaging system. The single modality imaging system may include, for example, the MRI system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

A multitasking technique is used in dynamic MRI for acquiring MRI data of multiple dimensions (e.g., information relating to various physiological motions, relaxations, etc.) in a single MRI scan. Usually, the multitasking technique may acquire navigator data in the MRI data by sampling a same K-space line through the center of K-space repeatedly and periodically. Imaging data in the MRI data may be acquired using a pseudo-random trajectory collection manner by sampling different K-space lines in K-space. For example, according to a certain probability distribution, the multitasking technique may randomly generate phase encodings according to predetermined phase encoding number and slab encoding number and collect imaging data.

Recently, a multitasking technology based on a partial separable spatio-temporal imaging technology has been proposed to improve the imaging accuracy and efficiency of MRI by extending the two-dimensional space-time matrix imaging technology to the multi-dimensional time-space tensor imaging technology, which forms a technology that can process multiple dynamic dimensions at the same time, and can reconstruct multi-dimensional images with multiple dynamic dimensions and quantitative dimensions with relatively little data. Conventionally, the multitasking technique based on the partial separable spatio-temporal imaging technology directly divides a plurality of sets of original k-space data collected during a plurality of acquisition periods into a plurality of bins corresponding to multiple physiological phases (e.g., respiratory phases). Then, a matrix including the plurality sets of k-space data is generated based on the plurality of bins and the plurality of acquisition periods. Further, a dynamic MR image sequence is generated based on the matrix. That is, the dynamic MR image sequence is generated using data that has not been corrected for intra-bin physiological motion (e.g., remaining respiratory motion within data of a same respiratory bin). However, due to the effect of the intra-bin physiological motion, the dynamic MR image sequence generated using the conventional multitasking technique has a limited imaging accuracy.

An aspect of the present disclosure relates to systems and methods for dynamic MRI using the multitasking technique based on the partial separable spatio-temporal imaging technology. The systems may obtain a plurality of sets of k-space data of a region of interest (ROI) of a subject. Each of the plurality of sets of k-space data may be collected during one of a plurality of acquisition periods after an MR sequence is applied on the subject, and the ROI may be affected by a physiological motion (e.g., respiratory motion, cardiac motion) of the subject. For each of the plurality of sets of k-space data, the systems may determine position information of a reference region during the corresponding acquisition period based on the set of k-space data. Then, for each of the plurality of sets of k-space data, the systems may correct the set of k-space data based on the position information of the reference region. Further, the systems may generate a dynamic MR image sequence based on the plurality sets of corrected k-space data.

Compared with the conventional dynamic MRI approach, the methods and systems of the present disclosure correct the sets of original k-space data based on the position information of the reference region and further generate the dynamic MR image sequence based on the sets of corrected k-space data, which may reduce or eliminate the effect of the physiological motion, thereby improving the accuracy of the obtained dynamic MR image sequence.

FIG. 1 is a schematic diagram illustrating an exemplary MRI system 100 according to some embodiments of the present disclosure. As shown in FIG. 1, the MRI system 100 may include an MRI scanner 110, a processing device 120, a storage device 130, one or more terminals 140, and a network 150. In some embodiments, the MRI scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MRI scanner 110 may be connected to the processing device 120 through the network 150. As another example, the MRI scanner 110 may be connected to the processing device 120 directly.

The MRI scanner 110 may be configured to scan a subject (or a part of the subject) to acquire image data, such as MRI signals (also referred to as MR signals) associated with the subject. For example, the MRI scanner 110 may detect a plurality of MRI signals by applying an MRI pulse sequence on the subject.

In some embodiments, the MRI scanner 110 may include, for example, a main magnet, a gradient coil (or also referred to as a spatial encoding coil), a radio frequency (RF) coil, etc. In some embodiments, the MRI scanner 110 may be a permanent magnet MRI scanner, a superconducting electromagnet MRI scanner, or a resistive electromagnet MRI scanner, etc., according to the types of the main magnet. In some embodiments, the MRI scanner 110 may be a high-field MRI scanner, a mid-field MRI scanner, and a low-field MRI scanner, etc., according to the intensity of the magnetic field.

The subject scanned by the MRI scanner 110 may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, heart, stomach, blood vessel, soft tissue, knee, feet, or the like, or a combination thereof.

For illustration purposes, a coordinate system 160 including an X axis, a Y-axis, and a Z-axis is provided in FIG. 1. The X axis and the Z axis shown in FIG. 1 may be horizontal, and the Y-axis may be vertical. As illustrated, the positive X direction along the X axis may be from the right side to the left side of the MRI scanner 110 seen from the direction facing the front of the MRI scanner 110; the positive Y direction along the Y axis shown in FIG. 1 may be from the lower part to the upper part of the MRI scanner 110; the positive Z direction along the Z axis shown in FIG. 1 may refer to a direction in which the subject is moved out of the scanning channel (or referred to as the bore) of the MRI scanner 110.

The processing device 120 may process data and/or information obtained from the MRI scanner 110, the storage device 130, and/or the terminal(s) 140. For example, the processing device 120 may generate a dynamic MR image sequence in the process of an MRI scan of the subject based on MRI signals collected by the MRI scanner 110.

In some embodiments, the processing device 120 may be a single server or a server group. The server group may be centralized or distributed. In some embodiments, the processing device 120 may be local or remote. Merely for illustration, only one processing device 120 is described in the medical system 100. However, it should be noted that the medical system 100 in the present disclosure may also include multiple processing devices. Thus operations and/or method steps that are performed by one processing device 120 as described in the present disclosure may also be jointly or separately performed by the multiple processing devices. For example, if in the present disclosure the processing device 120 of the medical system 100 executes both process A and process B, it should be understood that the process A and the process B may also be performed by two or more different processing devices jointly or separately in the medical system 100 (e.g., a first processing device executes process A and a second processing device executes process B, or the first and second processing devices jointly execute processes A and B).

The storage device 130 may store data, instructions, and/or any other information. In some embodiments, the storage device 130 may store data obtained from the MRI scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may be connected to the network 150 to communicate with one or more other components in the MRI system 100 (e.g., the MRI scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable user interaction between a user and the MRI system 100. For example, the terminal(s) 140 may display the dynamic MR image sequence of the subject. In some embodiments, the terminal(s) 140 may be connected to and/or communicate with the MRI scanner 110, the processing device 120, and/or the storage device 130. In some embodiments, the terminal(s) 140 may include a mobile device 140-1, a tablet computer 140-2, a laptop computer 140-3, or the like, or a combination thereof. In some embodiments, the terminal(s) 140 may be part of the processing device 120 or the MRI scanner 110.

The network 150 may include any suitable network that can facilitate the exchange of information and/or data for the MRI system 100. In some embodiments, one or more components of the MRI system 100 (e.g., the MRI scanner 110, the processing device 120, the storage device 130, the terminal(s) 140, etc.) may communicate information and/or data with one or more other components of the MRI system 100 via the network 150.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI scanner 110. As another example, a component of the MRI system 100 may be replaced by another component that can implement the functions of the component. However, those variations and modifications do not depart from the scope of the present disclosure.

Figure 2:
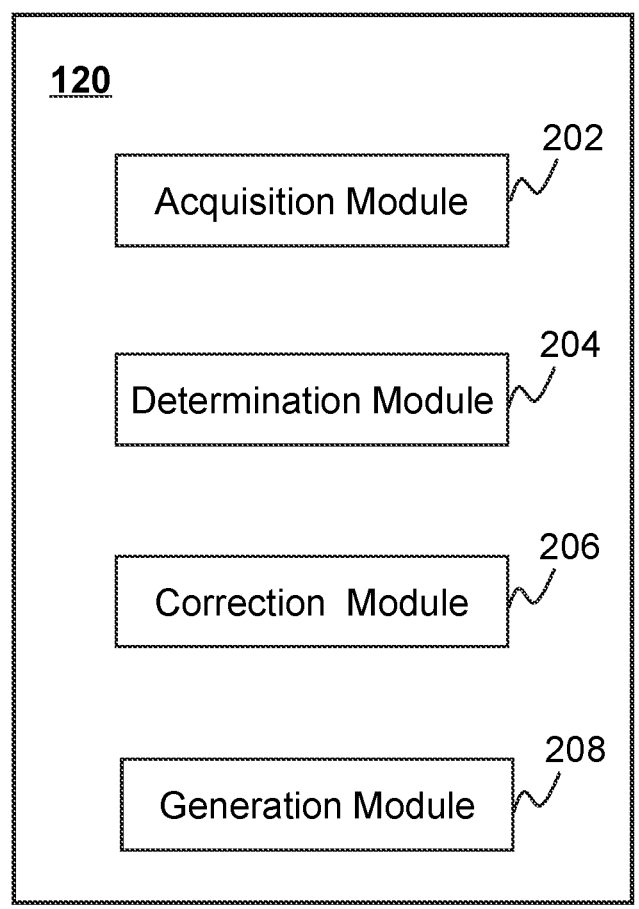
FIG. 2 is a block diagram illustrating an exemplary processing device according to some embodiments of the present disclosure.

FIG. 2 is a block diagram illustrating an exemplary processing device 120 according to some embodiments of the present disclosure.

As shown in FIG. 2, the processing device 120 may include an acquisition module 202, a determination module 204, a correction module 206, and a generation module 208.

As described in FIG. 1, the MRI system 100 in the present disclosure may also include multiple processing devices, and the acquisition module 202, the determination module 204, the correction module 206, and the generation module 208 may be components of different processing devices.

The acquisition module 202 may be configured to obtain information relating to the MRI system 100. For example, the acquisition module 202 may obtain a plurality of sets of k-space data of a region of interest (ROI) of a subject. More descriptions regarding the obtaining of the plurality of sets of k-space data may be found elsewhere in the present disclosure. See, e.g., operation 310 in FIG. 3, and relevant descriptions thereof. As another example, the acquisition module 220 may be configured to obtain a plurality of initial MR images of a region of interest (ROI) of a subject. More descriptions regarding the obtaining of the plurality of initial MR images of the ROI may be found elsewhere in the present disclosure. See, e.g., operation 610 in FIG. 6, and relevant descriptions thereof.

The determination module 204 may be configured to, for each of the plurality of sets of k-space data, determine position information of a reference region during the corresponding acquisition period based on the set of k-space data. In some embodiments, for each set of k-space data, the determination module 204 may generate an initial MR image (also referred to as a first initial MR image) of the ROI based on the set of k-space data, and determine the position information of the reference region during the corresponding acquisition period based on the initial MR image. More descriptions regarding the determination of the position information of the reference region may be found elsewhere in the present disclosure. See, e.g., operation 320 in FIG. 3, and relevant descriptions thereof.

In some embodiments, the determination module 204 may be also configured to, for each of the plurality of acquisition periods, determine reference navigator data corresponding to the acquisition period based on the registered MR image corresponding to the acquisition period. More descriptions regarding the determination of the reference navigator data corresponding to the acquisition period may be found elsewhere in the present disclosure. See, e.g., operation 630 in FIG. 6, and relevant descriptions thereof.

The correction module 206 may be configured to, for each of the plurality of sets of k-space data, correct the set of k-space data based on the position information of the reference region. More descriptions regarding the correction of the set of k-space data may be found elsewhere in the present disclosure. See, e.g., operation 330 in FIG. 3, and relevant descriptions thereof.

The generation module 208 may be configured to generate a dynamic MR image sequence based on the plurality sets of corrected k-space data. The dynamic MR image sequence may include multiple MR images. For example, the dynamic MR image sequence may include 3D cardiac MR images in one or more cardiac periods. More descriptions regarding the generation of the dynamic MR image sequence based on the plurality sets of corrected k-space data may be found elsewhere in the present disclosure. See, e.g., operation 340 in FIG. 3, and relevant descriptions thereof.

In some embodiments, the generation module 208 may be also configured to generate a plurality of registered MR images corresponding to the plurality of acquisition periods by performing image registration between the plurality of initial MR images. More descriptions regarding the generation of the plurality of registered MR images may be found elsewhere in the present disclosure. See, e.g., operation 620 in FIG. 6, and relevant descriptions thereof.

In some embodiments, the generation module 208 may be also configured to generate a dynamic MR image sequence based on the reference navigator data and the registered MR image of each acquisition period. More descriptions regarding the generation of the dynamic MR image sequence based on the reference navigator data and the registered MR image of each acquisition period may be found elsewhere in the present disclosure. See, e.g., operation 640 in FIG. 6, and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, any one of the modules may be divided into two or more units. For instance, the acquisition module 202 may be divided into two units configured to acquire different data. In some embodiments, the processing device 120 may include one or more additional modules, such as a storage module (not shown) for storing data.

Figure 3:
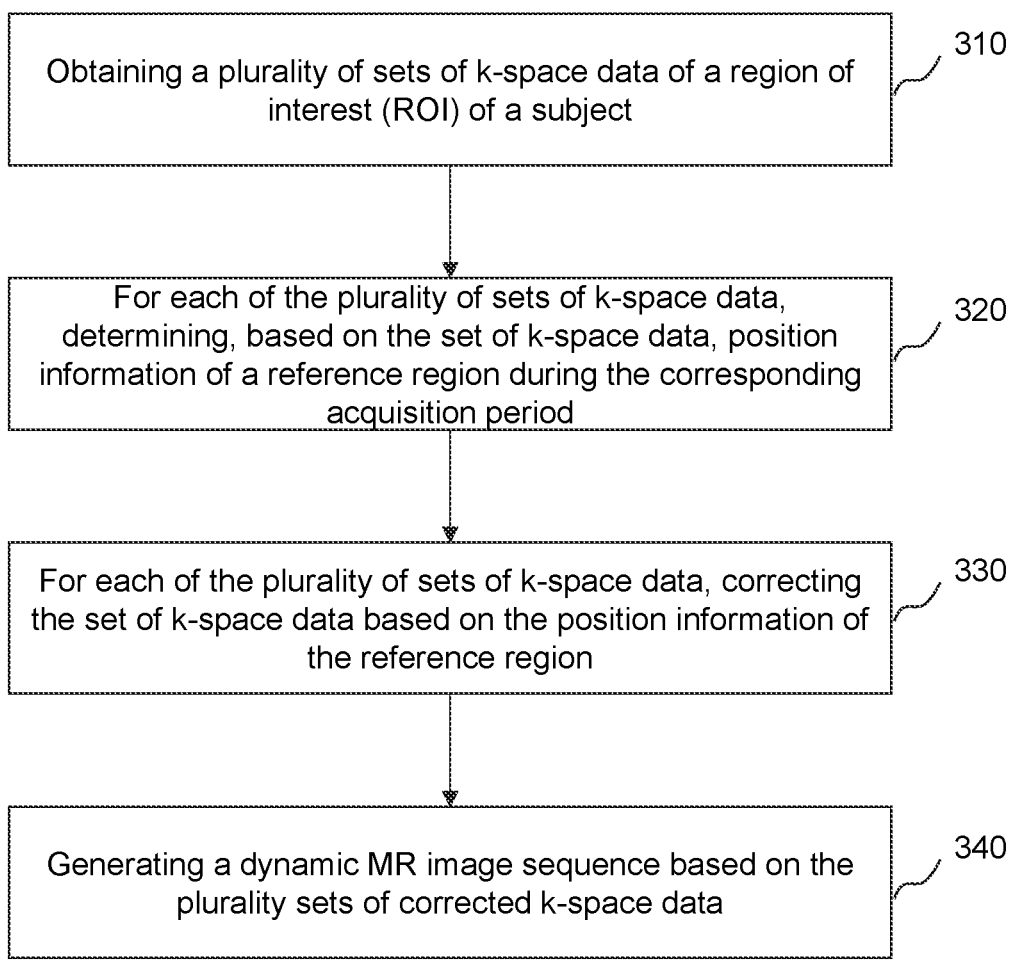
FIG. 3 is a flowchart illustrating an exemplary process for dynamic MRI according to some embodiments of the present disclosure.

FIG. 3 is a flowchart illustrating an exemplary process 300 for dynamic MRI according to some embodiments of the present disclosure. In some embodiments, process 300 may be executed by the MRI system 100. For example, the process 300 may be implemented as a set of instructions (e.g., an application) stored in a storage device (e.g., the storage device 130). In some embodiments, the processing device 120 (e.g., one or more modules illustrated in FIG. 2) may execute the set of instructions and may accordingly be directed to perform the process 300. The operations of the illustrated process presented below are intended to be illustrative. In some embodiments, the process 300 may be accomplished with one or more additional operations not described and/or without one or more of the operations discussed. Additionally, the order of the operations of process 300 illustrated in FIG. 3 and described below is not intended to be limiting.

In 310, the processing device 120 (e.g., the acquisition module 202) may obtain a plurality of sets of k-space data of a region of interest (ROI) of a subject.

As used herein, an ROI of a subject refers to a physical region of interest of the subject or a portion in an image that corresponds to the physical region of interest. For example, the ROI of the subject may include one or more specific organs and/or one or more specific tissues of the subject. In some embodiments, the ROI may include a lesion of the subject. A lesion refers to damage (or potential damage) and/or an abnormal change (or potential change) in the tissue of the subject, usually caused by disease or trauma. In some embodiments, the ROI may include a region (e.g., the abdomen, the chest, a kidney, a liver, etc.) of the subject that is influenced or affected by the physiological motion of the subject. The physiological motion may include a cardiac motion, a respiratory motion, etc. For example, the ROI includes the chest of the subject that moves due to the respiratory motion of the subject.

The sets of k-space data may be collected by the MRI scanner 110 during an MR scan of the ROI after an MR sequence is applied on the subject. In some embodiments, the MR scan is divided into a plurality of acquisition periods, and each of the plurality of sets of k-space data may be collected by the MRI scanner 110 during one of a plurality of acquisition periods. In some embodiments, the duration of an acquisition period may be set manually by a user (e.g., an engineer) according to an experience value or a default setting of the MRI system 100, or determined by the processing device 120 according to an actual need, such as 0.05 seconds, 0.1 seconds, 0.5 seconds, 1 second, or a larger or smaller value. In some embodiments, the duration of the acquisition period may be set according to a cycle of physiological motion. For example, the respiratory motion is relatively slow, which may require a relatively low temporal resolution, the duration of the acquisition period may be relatively long. As another example, the cardiac motion is relatively quick, which may require a relatively high temporal resolution, the duration of the acquisition period may be relatively short.

In some embodiments, the MR sequence may be specially designed such that anatomical information of the ROI can be recovered from the sets of k-space data while the physiological motion of the ROI can be tracked. In some embodiments, a set of k-space data may include navigator data (also referred to as auxiliary data) and imaging data collected in the corresponding acquisition period. The navigator data may include high-temporal resolution data relating to at least one time-varying dimension of the subject. The at least one time-varying dimension may include any dimension that reflects time-varying characteristics or dynamic information of the subject. In some embodiments, the at least one time-varying dimension of the subject may include a dimension relating to an elapsed time. In some embodiments, the at least one time-varying dimension of the subject may include one or more dimensions relating to other information, such as a cardiac motion, a respiratory motion, a T1 relaxation, a T2 relaxation, a chemical exchange saturation transfer (CEST), a contrast agent dynamic, a T1ρ contrast, a molecular diffusion, etc. In some embodiments, the navigator data may correspond to the same subset of K-space (e.g., which includes one or more K-space lines) and be collected by sampling the subset of K-space repeatedly with a high sampling frequency. In some embodiments, the navigator data may have no phase encoding.

The imaging data may include high-spatial resolution image data relating to at least one spatial-varying dimension of the subject. Exemplary spatial-varying dimensions may relate to a phase encoding direction, a frequency encoding direction, or the like, or any combination thereof. In some embodiments, the imaging data may be acquired using a pseudo-random trajectory collection manner by sampling different K-space lines in K-space. In some embodiments, the imaging data may have phase encodings, for example, the phase encodings of the imaging data may conform to a random Gaussian distribution.

In some embodiments, the processing device 120 may directly obtain the plurality of sets of k-space data from the MRI scanner 110. In some embodiments, the plurality of sets of k-space data may be previously stored in a storage device (e.g., the storage device 130 or an external source). The processing device 120 may retrieve the plurality of sets of k-space data from the storage device.

In 320, for each of the plurality of sets of k-space data, the processing device 120 (e.g., the determination module 204) may determine, based on the set of k-space data, position information of a reference region during the corresponding acquisition period.

In some embodiments, for each set of k-space data, the processing device 120 may generate an initial MR image (also referred to as a first initial MR image) of the ROI based on the set of k-space data; and determine the position information of the reference region during the corresponding acquisition period based on the initial MR image. As used herein, the reference region refers to a region that can reflect a motion of the ROI caused or influenced by the physiological motion of the subject. In some embodiments, the reference region may be part of the ROI. For example, the reference region can be easily identified or segmented from the initial MR image and has more obvious motion along with the physiological motion than other regions of the ROI. In some embodiments, the reference region may be located between a first region and a second region, for example, the reference region may be an interface between the first region and the second region. The first region and the second region may correspond to different organs or tissues. For example, the physiological motion may include a respiratory motion, the first region and the second region may be a lung and a diaphragm of the subject, and the reference region may be an interface between the lung and the diaphragm. Alternatively, the first region and the second region may be a lung and the liver of the subject, and the reference region may be an interface between the lung and the liver of the subject.

In some embodiments, the generation of an initial MR image based on a set of k-space data may be performed in the following way. The processing device 120 may determine a temporal factor based on the navigator data in the set of k-space data. Then, the processing device 120 may determine a spatial factor based on the temporal factor and the imaging data in the set of k-space data. Further, the processing device 120 may generate the initial MR image of the ROI based on the spatial factor and the temporal factor.

A temporal factor may include one or more temporal basis functions relating to the elapsed time. Each temporal basis function may relate to a time-varying dimension of the subject. In some embodiments, the temporal factor may include one or more cardiac temporal basis functions relating to the cardiac motion of the subject, one or more respiratory temporal basis functions relating to the respiratory motion of the subject, one or more T1 recovery temporal basis functions relating to the T1 relaxation of the subject, or the like, or any combination thereof. A temporal basis function relating to a time-varying dimension may reflect dynamic information along the time-varying dimension and include high-temporal resolution information.

A spatial factor of the subject may include high-spatial resolution information along a spatial-varying dimension. For example, the spatial factor may reflect a relationship between pixel information of the subject in the image domain and spatial information of the subject in the physical domain. In some embodiments, the spatial factor may be represented as a basis image that includes high-spatial resolution information. Different spatial factors may be represented as basis images that include different high-spatial resolution information.

Merely by way of example, the navigator data may be in the form of a K-space matrix. The processing device 120 may determine the temporal factor based on the K-space matrix. For example, the processing device 120 may determine the temporal factor by performing a singular value decomposition (SVD) on the K-space matrix. Further, the processing device 120 may construct an optimization function relating to the spatial factor. The optimization function may incorporate the imaging data and the temporal factor. The processing device 120 may determine the spatial factor by solving the optimization function based on the temporal factor and the imaging data. Then, the processing device 120 may generate the initial MR image of the ROI based on the spatial factor and the temporal factor. For example, the processing device 120 may generate the initial MR image by determining a product of the temporal factor and the spatial factor, wherein the product may be in the form of a multi-dimensional tensor for representing the initial MR image.

Further, after an initial MR image of an acquisition period is generated, the processing device 120 may segment a first region and a second region from the initial MR image, and determine the position information of the reference region during the acquisition period based on the first region and the second region.

In some embodiments, the first region and the second region may be segmented from the initial MR image manually by a user (e.g., a doctor, an imaging specialist, a technician) by, for example, drawing a bounding box on the initial MR image displayed on a user interface. Alternatively, the initial MR image may be segmented by the processing device 120 automatically according to an image analysis algorithm (e.g., an image segmentation algorithm). For example, the processing device 120 may perform image segmentation on the initial MR image using an image segmentation algorithm. Exemplary image segmentation algorithms may include a thresholding segmentation algorithm, a compression-based algorithm, an edge detection algorithm, a machine learning-based segmentation algorithm, or the like, or any combination thereof. Alternatively, the first region and the second region may be segmented by the processing device 120 semi-automatically based on an image analysis algorithm in combination with information provided by a user. Exemplary information provided by the user may include a parameter relating to the image analysis algorithm, a position parameter relating to a region to be segmented, an adjustment to, or rejection or confirmation of a preliminary segmentation result generated by the processing device 120, etc.

In some embodiments, the first region and the second region may be identified in the segmented initial MR image. For example, in the segmented initial MR image, a pixel (or voxel) corresponding to the first region may be displayed in black, and a pixel (or voxel) corresponding to the second region may be displayed in white. As another example, the segmented initial MR image may be represented as a segmentation mask. In the segmentation mask, elements having a label of "1" represent the first region and elements having a label of "0" represent the second region. The processing device 120 may extract an interface between the first region and the second region, and designate the interface as the reference region. The processing device 120 may determine the position information of the reference region in a preset coordinate system (e.g., an image coordinate system of the initial MR image, a coordinate system as shown in FIG. 1). In some embodiments, the position information of the reference region may include position information along the motion direction of the physiological motion described in operation 330. For example, the position information of the reference region may include a coordinate of the reference region along the motion direction of the physiological motion in the preset coordinate system.

In 330, for each of the plurality of sets of k-space data, the processing device 120 (e.g., the correction module 206) may correct the set of k-space data based on the position information of the reference region.

For brevity, the correction of the sets of k-space data in operation 330 may be referred to as a rigid calibration of the sets of k-space data.

In some embodiments, the processing device 120 may correct the navigator data of a set of k-space data. Specifically, the processing device 120 may determine a motion direction of the physiological motion and a readout direction of the navigator data. In some embodiments, the motion direction of the physiological motion may be a direction along which the ROI has a relatively large motion magnitude. In some embodiments, the motion direction of the physiological motion may be predetermined based on the type of the physiological motion by, for example, a doctor according to experience. For example, the motion direction of the respiratory motion of a human may be a direction between the head and the feet. Alternatively, the motion direction of the physiological motion may be determined by tracking the position of the reference region during the MR scan based on the position information determined in operation 320. In some embodiments, the readout direction of the navigator data and the motion direction of the physiological motion may be parallel to or intersect with each other.

Further, the processing device 120 may determine a first angle between the motion direction of the physiological motion and the readout direction of the navigator data, and correct the navigator data based on the position information of the reference region and the first angle. In some embodiments, the processing device 120 may determine a first motion component of the physiological motion in the readout direction of the navigator data and a second motion component of the physiological motion in a direction perpendicular to the readout direction of the navigator data based on the first angle. Further, the processing device 120 may correct the navigator data based on the position information of the reference region, the first motion component, and the second motion. More descriptions regarding the correction of the navigator data may be found elsewhere in the present disclosure (e.g., FIG. 4 and the descriptions thereof).

In some embodiments, the processing device 120 may correct the imaging data of a set of k-space data. Specifically, the processing device 120 may determine the motion direction of the physiological motion and a readout direction of the imaging data. In some embodiments, the readout direction of the imaging data may be a direction along which scan data can be acquired efficiently (e.g., a direction along which the ROI has smallest length). For example, if the ROI is a liver of a human, the readout direction of the imaging data may be a direction between the left and the right of the human. In some embodiments, the readout direction of the imaging data and the motion direction of the physiological motion may be parallel to or intersect with each other. Further, the processing device 120 may determine a second angle between the motion direction of the physiological motion and the readout direction of the imaging data, and correct the imaging data based on the position information of the reference region and the second angle. In some embodiments, the correction of the imaging data may be performed in a similar manner as that of the navigator data. For example, the processing device 120 may determine a third motion component of the physiological motion in the readout direction of the imaging data and a fourth motion component of the physiological motion in a direction perpendicular to the readout direction of the imaging data. Further, the processing device 120 may correct the imaging data based on the position information of the reference region, the third motion component, and the fourth motion component.

In some embodiments, the processing device 120 may correct one or both of the navigator data or the imaging data according to actual needs. For example, if the imaging data is corrected, other parts of the subject (e.g., the spine) in a resulting image may move, so the processing device 120 may only correct the navigation data.

In 340, the processing device 120 (e.g., the generation module 208) may generate a dynamic MR image sequence based on the plurality sets of corrected k-space data.

The dynamic MR image sequence may include multiple MR images. For example, the dynamic MR image sequence may include 3D cardiac MR images in one or more cardiac periods.

In some embodiments, the processing device 120 may divide the plurality sets of corrected k-space data into a plurality of bins based on the position information of the reference region corresponding to the plurality of acquisition periods. Each of the plurality of bins may correspond to a physiological phase of the physiological motion. For example, for the respiratory motion, the bins may correspond to an intermediate inspiratory phase, an end-inspiratory phase, an intermediate expiratory phase, and an end-expiratory phase of the subject, respectively. In some embodiments, the processing device 120 may obtain a reference range of the reference region corresponding to each of the plurality of bins (or the plurality of physiological phases). The reference range corresponding to a bin may be an estimated range where the reference region may be located during the physiological phase corresponding to the bin. Then, the processing device 120 may divide the plurality sets of corrected k-space data into the plurality of bins according to the reference ranges and the positions of the reference region corresponding to the plurality of acquisition periods. Taking the respiratory motion for instance, four reference ranges of the reference region corresponding to the four respiratory phases may be obtained. If the reference region in an acquisition period is located in the reference range corresponding to the end-inspiratory phase, the set of k-space data of this acquisition period may be divided into the bin corresponding to the end-inspiratory phase.

The processing device 120 may generate an initial matrix including the plurality sets of corrected k-space data based on the plurality of bins and the plurality of acquisition periods. In some embodiments, the initial matrix may be a multidimensional matrix or tensor. Merely by way of example, if the physiological motion is the respiratory motion, the initial matrix may be a two-dimensional matrix including a respiratory phase dimension and a time dimension. The respiratory phase dimension may reflect a respiratory phase of the respiratory motion corresponding to a set of corrected k-space data. The time dimension may be a dimension relating to an elapsed time. For example, if the dynamic MRI is a dynamic contrast enhanced (DCE) imaging, the time dimension may reflect a change of a contrast agent for the DCE imaging over the elapsed time, which may be also referred to as a DCE time-course dimension. in some embodiments, the time dimension may be associated with the temporal resolution of the dynamic image sequence to be generated. For example, if the temporal resolution of the dynamic image sequence is 4 seconds, that is, each image in the dynamic image sequence is reconstructed using data collected in 4 seconds, a unit of a coordinate in the time dimension may be 4 seconds. For example, the coordinate 1 in the time dimension represents a time period of 0-4 seconds, the coordinate 2 in the time dimension represents a time period of 4-8 seconds, etc.

For each of the plurality sets of corrected k-space data, the processing device 120 may determine a coordinate corresponding to the set of corrected k-space data in the initial matrix based on the bin and the acquisition period corresponding to the set of corrected k-space data. For example, if the respiratory cycle of the subject is 3 seconds and every 0.5 seconds corresponds to one respiratory phase, coordinates 1-6 in the respiratory phase dimension may represent 6 respiratory phases, respectively. If the temporal resolution of the dynamic image sequence is 5 seconds, the coordinate 1 in the time dimension represents a time period of 0-5 seconds, the coordinate 2 in the time dimension represents a time period of 5-10 seconds, etc. It is assumed that the duration of each acquisition period is 0.5 seconds, the first coordinate of the initial matrix is the respiratory phase dimension, and the second coordinate of the initial matrix is the time dimension. In such cases, the coordinate corresponding to the first set of corrected k-space data collected in 0-0.5 seconds may be (1,1), and the coordinate corresponding to the second set of corrected k-space data collected in 0.5-1 seconds may be (2,1). Further, the processing device 120 may fill the sets of corrected k-space data into the initial matrix according to the coordinates corresponding to the plurality sets of corrected k-space data. For example, the processing device 120 may fill the first set of corrected k-space data and the second set of corrected k-space data into the position (1,1) and (2,1) in the initial matrix, respectively.

Further, the processing device 120 may generate a completion matrix by completing the initial matrix. In some embodiments, the processing device 120 may generate the completion matrix by completing empty positions in the initial matrix according to an algorithm such as a low rank algorithm.

Then, the processing device 120 may generate the dynamic MR image sequence based on the completion matrix. Specifically, the processing device 120 may determine a temporal factor based on the completion matrix. For example, the processing device 120 may determine the temporal factor by performing a SVD on the completion matrix. Then, the processing device 120 may determine a spatial factor based on the temporal factor. Further, the processing device 120 may generate the dynamic MR image sequence based on the spatial factor and the temporal factor.

In some embodiments, the processing device 120 may further perform a non-rigid calibration on the plurality of sets of corrected k-space data to generate a plurality of sets of reference k-space data, and generate the dynamic MR image sequence based on the plurality of sets of reference k-space data. Each set of the plurality of sets of reference k-space data may include reference navigator data and reference imaging data. Specifically, the processing device 120 may reconstruct a plurality of second initial MR images based on the plurality of sets of corrected k-space data. The processing device 120 may generate a plurality of registered MR images corresponding to the plurality of acquisition periods by performing image registration between the plurality of second initial MR images. For each of the plurality of acquisition periods, the processing device 120 may determine reference navigator data corresponding to the acquisition period based on the registered MR image corresponding to the acquisition period. Further, for the registered MR image of each acquisition period, the processing device 120 may determine reference imaging data in k-space by performing a Fourier transform on the registered MR image. More descriptions regarding the non-rigid calibration may be found elsewhere in the present disclosure (e.g., FIG. 6 and the descriptions thereof).

In some embodiments, the processing device 120 may perform the non-rigid calibration on each of the plurality of sets of k-space data before operation 330 is performed. That is, the order of the rigid calibration and the non-rigid calibration of the set of k-space data is not intended to be limiting. In some embodiments, the processing device 120 may perform one or both of the non-rigid calibration and the rigid calibration according to actual needs. For example, if the sets of corrected k-space data after the rigid calibration is performed have a relatively large accuracy, the non-rigid calibration may not need to be performed.

As described in elsewhere of the present disclosure, in the conventional dynamic MRI imaging approach, the dynamic MR image sequence is generated using data that has not been corrected for physiological motion, which has a limited imaging accuracy. Compared with the conventional dynamic MRI approach, some embodiments of the present disclosure may correct the sets of original k-space data based on the position information of the reference region and further generate the dynamic MR image sequence based on the sets of corrected k-space data, which may reduce or eliminate the effect of the physiological motion, thereby improving the accuracy of the obtained dynamic MR image sequence. Moreover, the rigid calibration of the physiological motion is performed continuously based on the tracked position of the reference region, not limited to the number of the bins, which may be simple and feasible, and result in a more smooth dynamic image sequence without standstill.

It should be noted that the above description regarding the process 300 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 300 may be accomplished with one or more additional operations not described and/or without one or more of the operations discussed above. For example, the process 300 may include an additional operation to transmit the dynamic MR image sequence to a terminal device (e.g., a terminal 140 of a doctor) for display. As another example, the methods of the present disclosure may be applied in golden-angle radial sparse parallel (GRASP) technology to optimize the GRASP technology.

FIG. 4 is a flowchart illustrating an exemplary process 400 for correcting navigator data of a subject corresponding to an acquisition period according to some embodiments of the present disclosure. In some embodiments, process 400 may be executed by the MRI system 100. For example, the process 400 may be implemented as a set of instructions (e.g., an application) stored in a storage device (e.g., the storage device 130). In some embodiments, the processing device 120 (e.g., one or more modules illustrated in FIG. 2) may execute the set of instructions and may accordingly be directed to perform the process 400. The operations of the illustrated process presented below are intended to be illustrative. In some embodiments, the process 400 may be accomplished with one or more additional operations not described and/or without one or more of the operations discussed. Additionally, the order of the operations of process 400 illustrated in FIG. 4 and described below is not intended to be limiting.

In some embodiments, one or more operations of the process 400 may be performed to achieve at least part of operation 330 as described in connection with FIG. 3.

In 410, the processing device 120 (e.g., the correction module 206) may determine, based on a first angle between a motion direction of the physiological motion and a readout direction of the navigator data, a first motion component of the physiological motion in the readout direction of the navigator data and a second motion component of the physiological motion in a direction perpendicular to the readout direction of the navigator data. For example, the first motion component of the physiological motion may represent the motion amplitude of the ROI (or the reference region) caused by the physiological motion along the readout direction of the navigator data during the acquisition period. The second motion component of the physiological motion may represent the motion amplitude of the ROI (or the reference region) caused by the physiological motion along the direction perpendicular to the readout direction of the navigator data during the acquisition period.

In some embodiments, the first angle may be in a range of 0°-90°. The processing device 120 may determine an overall motion of the physiological motion in the acquisition period, and further determine the first motion component and the second motion component based on the first angle and the motion component of the physiological motion. In some embodiments, the overall motion of the physiological motion in the acquisition period may be represented by a distance between a position of the reference region in the acquisition period and a reference position. The reference position may be set manually by a user (e.g., an engineer) according to experience or a default setting of the MRI system 100, or determined by the processing device 120 according to an actual need. For example, if the physiological motion is a respiratory motion and the reference region is an interface between a lung and a diaphragm of the subject, the reference position may be a position of the interface between the lung and the diaphragm at the end-inspiratory phase or end-expiratory phase of the subject.

Merely by way of example, FIG. 5 is a schematic diagram illustrating a first motion component and a second motion component of the physiological motion corresponding to an acquisition period according to some embodiments of the present disclosure. As shown in FIG. 5, an overall motion a of the physiological motion during the acquisition period may be measured by a distance between a position $z_t$ of the reference region in the acquisition period and a reference position $z_0$. The first angle between a motion direction M of the physiological motion and a readout direction N of the navigator data corresponding to the acquisition period is an angle θ. The first motion component $a_1$ of the physiological motion in the readout direction N of the navigator data may be a*cos θ, and the second motion component $a_2$ of the physiological motion in the direction I perpendicular to the readout direction N of the navigator data may be a*sin θ.

In 420, the processing device 120 (e.g., the correction module 206) may correct the navigator data based on the position information of the reference region, the first motion component, and the second motion component.

In response to determining that the second motion component is equal to 0, the processing device 120 may correct the navigator data based on the position information and the first motion component. In some embodiments, different points of the navigator data may be corrected based on the first motion component using different first phase correction factors. For example, the first phase correction factor of a point of the navigator data may be linearly correlated with the position of the point in k-space. In some embodiments, the first phase correction factor of each point of the navigator data may be determined based on a position of the point in k-space and the first motion component. Merely by way of example, the processing device 120 may determine the first phase correction factors according to Equation (1), and correct the navigator data using the first phase correction factors according to Equation (2):

$$\text{Factor}_1 = \exp\left(1j*(Z(t)-Z_0)_1 * \left(-\frac{NRO}{2}:\left(\frac{NRO}{2}-1\right)\right)\bigg/NRO*2*\pi\right), \quad (1)$$

$$dnav(t)^* = IFFT(FFT(dnav(t))*\text{Factor}_1), \quad (2)$$

where, $\text{Factor}_1$ denotes the first phase correction factors, $dnav(t)^*$ denotes the corrected navigation data, $dnav(t)$ denotes the navigation data, FFT denotes fast Fourier transform, IFFT denotes inverse fast Fourier transform, 1j denotes purely imaginary number, $Z_0$ denotes the reference position, $Z(t)$ denotes the position of the reference region corresponding to the acquisition period, $(Z(t)-Z_0)_1$ denotes the first motion component (the motion of the reference region with respect to the reference position in the acquisition period along the readout direction of the navigator data), and NRO denotes a count of points of the navigator data. (-NRO/2:(NRO/2-1)) may represent the positions of the points of the navigator data in k-space. For example, if the NRO is 64, the (-NRO/2:(NRO/2-1)) may be (-32, -31, -30, ..., -1, 0, 1, ..., 30, 31). The first phase correction factors may be exp(1j*(Z(t)-Z_0)*(-32, -31, -30, ..., -1, 0, 1, ..., 30, 31)/NRO*2*7). Therefore, the first phase correction factors of different points of the navigator data may be different, and a difference between values corresponding to the term (-NRO/2:(NRO/2-1) in two adjacent first phase correction factors may be equal to 1, that is, the first phase correction factors may change linearly.

In response to determining that the first motion component is equal to 0, the processing device 120 may correct the navigator data based on the position information and the second motion component. In some embodiments, different points of the navigator data may be corrected based on the second motion component using a same second phase correction factor. In some embodiments, the second phase correction factor may be determined based on the second motion component and information relating to a slab encoding direction of the navigator data. Exemplary information relating to the slab encoding direction of the navigator data may include a slab encoding number corresponding to the acquisition period, a slab encoding number corresponding to the center of k-space in the slab encoding direction, a slab encoding resolution in the slab encoding direction, or the like, or any combination thereof. Merely by way of example, the processing device 120 may determine the second phase correction factor according to Equation (3), and correct the navigator data using the second phase correction factor according to Equation (4):

$$\text{Factor}_2 = \exp(1j*(Z(t)-Z_0)_2*(SPE(t)-SPE_0)*2*\pi/NSPE), \quad (3)$$

$$dnav(t)^* = dnav(t)*\text{Factor}_2, \quad (4)$$

where, $(Z(t)-Z_0)_2$ denotes the second motion component, SPE(t) denotes the slab encoding number corresponding to the acquisition period, $SPE_0$ denotes the slab encoding number corresponding to the center of k-space in the slab encoding direction, and NSPE denotes the slab encoding resolution in the slab encoding direction.

In response to determining that the first motion component and the second motion component are greater than 0, the processing device 120 may correct the navigator data using different first phase correction factors and a same second phase correction factor. In some embodiments, the first phase correction factor of each point of the navigator data may be determined based on the position of the point in k-space and the first motion component, and the second phase correction factor may be determined based on the second motion component and information relating to a slab encoding direction of the navigator data.

Merely by way of example, the processing device 120 may determine the first phase correction factors and the second phase correction factor according to Equations (5) and (6), and correct the navigator data using the first phase correction factors and the second phase correction factor according to Equation (7):

$$\text{Factor}_1 = \exp\left(1j*(Z(t)-Z_0)_3*\left(-\frac{NRO}{2}:\left(\frac{NRO}{2}-1\right)\right)/NRO*2*\pi\right), \quad (5)$$

$$\text{Factor}_2 = \exp(1j*(Z(t)-Z_0)_4*(SPE(t)-SPE_0)*2*\pi/NSPE), \quad (6)$$

$$dnav(t)^* = dnav(t)*\text{Factor}_1*\text{Factor}_2, \quad (7)$$

where, $(Z(t)-Z_0)_3$ denotes the first motion component, $(Z(t)-Z_0)_4$ denotes the second motion component.

Figure 6:
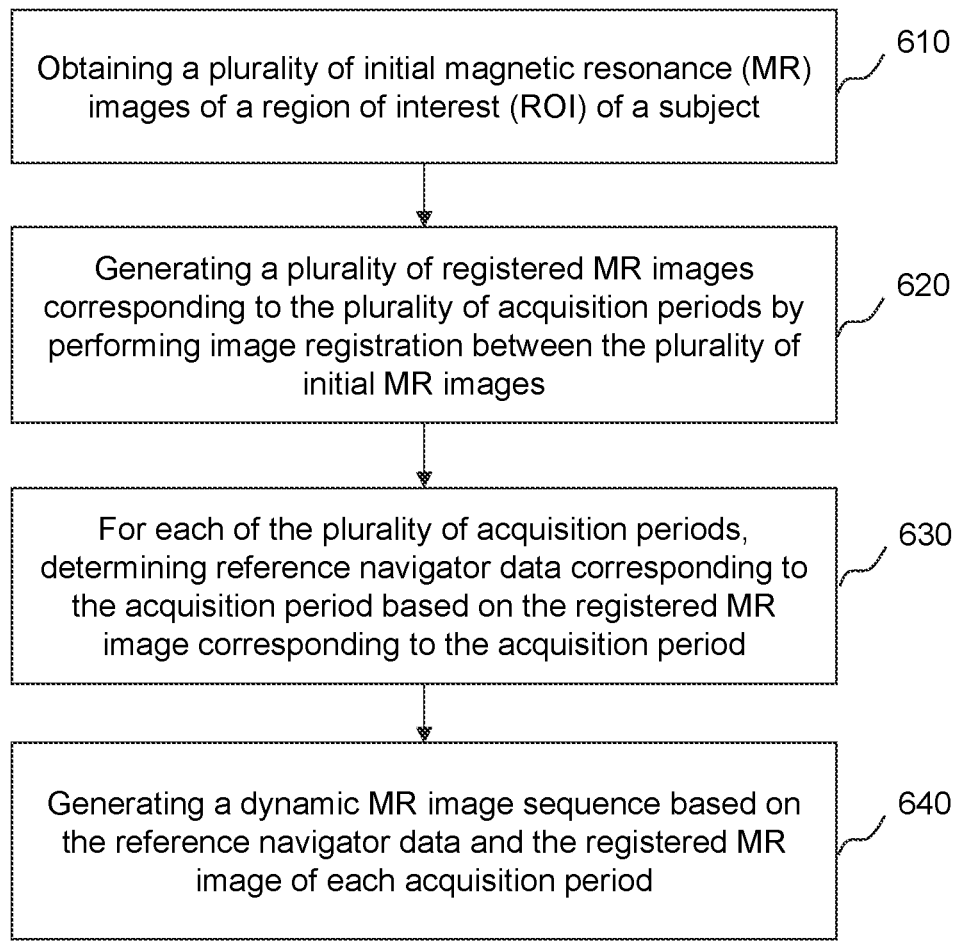
FIG. 6 is a flowchart illustrating an exemplary process for dynamic MRI according to some embodiments of the present disclosure.

FIG. 6 is a flowchart illustrating an exemplary process 600 for dynamic MRI according to some embodiments of the present disclosure. In some embodiments, process 600 may be executed by the MRI system 100. For example, the process 600 may be implemented as a set of instructions (e.g., an application) stored in a storage device (e.g., the storage device 130). In some embodiments, the processing device 120 (e.g., one or more modules illustrated in FIG. 2) may execute the set of instructions and may accordingly be directed to perform the process 600. The operations of the illustrated process presented below are intended to be illustrative. In some embodiments, the process 600 may be accomplished with one or more additional operations not described and/or without one or more of the operations discussed. Additionally, the order of the operations of process 600 illustrated in FIG. 6 and described below is not intended to be limiting.

In some embodiments, one or more operations of the process 600 may be performed to achieve at least part of operation 340 as described in connection with FIG. 3.

In 610, the processing device 120 (e.g., the acquisition module 202) may obtain a plurality of initial magnetic resonance (MR) images of a region of interest (ROI) of a subject.

In some embodiments, the ROI may be affected by a physiological motion. More descriptions regarding the ROI may be found elsewhere in the present disclosure. See, e.g., operation 310 in FIG. 3 and relevant descriptions thereof.

Each of the plurality of initial MR images may be reconstructed based on a set of k-space data collected during one of a plurality of acquisition periods after an MR sequence is applied on the ROI. In some embodiments, each of the plurality of initial MR images may be reconstructed in a similar manner as the generation of the first initial MR image in operation 320.

In 620, the processing device 120 (e.g., the generation module 208) may generate a plurality of registered MR images corresponding to the plurality of acquisition periods by performing image registration between the plurality of initial MR images.

In some embodiments, the processing device 120 may generate the plurality of registered MR images corresponding to the plurality of acquisition periods by performing image registration between the plurality of initial MR images using a non-rigid registration algorithm. Exemplary non-rigid registration algorithms may include an algorithm based on space transformation (e.g., a polynomial function algorithm, a spline algorithm, a basis function algorithm, etc.), an algorithm based on a pseudo-physical model (e.g., an algorithm based on an elastic model, an algorithm based on a viscous fluid model, an algorithm based on an optical flow model), etc.

In some embodiments, one initial MR image may be selected from the initial MR images and used as a reference MR image, and each of the other initial MR image(s) may be registered to the reference MR image. The registered MR images may include the reference MR image and the registered MR image corresponding to each of the other initial MR image(s).

In 630, for each of the plurality of acquisition periods, the processing device 120 (e.g., the determination module 204) may determine reference navigator data corresponding to the acquisition period based on the registered MR image corresponding to the acquisition period.

Since the image registration performed in operation 620 may result in that different parts of the initial MR images have different scaling and deformation, corrected navigation data cannot be directly determined from the registered MR images. Therefore, the navigation data of the sets of k-space data need to be corrected (resampled) based on the registered MR images by performing operation 630 after the image registration is performed. The reference navigator data may also be referred to the corrected (resampled) navigator data.

In some embodiments, for each of the plurality of acquisition periods, the corresponding set of k-space data may include navigator data, and the processing device 120 may determine a plurality of sectional images perpendicular to a readout direction of the navigator data corresponding to the acquisition period from the registered MR image of the acquisition period. Further, the processing device 120 may determine the reference navigator data of the acquisition period based on the plurality of sectional images. Merely by way of example, for each of the plurality of sectional images, the processing device 120 may determine a sum of pixel values of pixels in the sectional image. Then, the processing device 120 may determine the reference navigator data based on the sum corresponding to each of the plurality of sectional images. For example, a count of the plurality of sectional images may be equal to a count of data points in the reference navigator data, and each of the plurality of sectional images may correspond to one of the data points in the reference navigator data along the readout direction of the navigator data. For each of the plurality of sectional images, the processing device 120 may designate the sum corresponding to the sectional image as the value of the data point corresponding to the sectional image.

In 640, the processing device 120 (e.g., the generation module 208) may generate a dynamic MR image sequence based on the reference navigator data and the registered MR image of each acquisition period.

As described in elsewhere of the present disclosure, the dynamic MR image sequence may include multiple MR images changing over time. In some embodiments, for the registered MR image of each acquisition period, the processing device 120 obtain reference imaging data in k-space by performing a Fourier transform on the registered MR image. For brevity, the reference navigator data and the reference imaging data corresponding to each acquisition period may be referred to as a set of reference k-space data corresponding to each acquisition period. Further, the processing device 120 may generate the dynamic MR image sequence based on the plurality sets of reference k-space data corresponding to the plurality of acquisition periods. In some embodiments, the processing device 120 may generate the dynamic MR image sequence based on the plurality sets of reference k-space data in a similar manner as how the processing device 120 generates the dynamic MR image sequence based on the plurality sets of corrected k-space data as described in connection with operation 340, and the descriptions of which are not repeated here.

According to process 600, the processing device 120 may perform the non-rigid calibration on the plurality of sets of k-space data to generate the sets of reference k-space data, and generate the dynamic MR image sequence based on the sets of k-space data, which may reduce or eliminate the effect of the physiological motion, thereby improving the accuracy of the obtained dynamic MR image sequence. The non-rigid calibration may involve non-linear transformation and avoid some static anatomical structure (e.g., a spine) of the subject from being moved during the calibration process.

In some embodiments, the processing device 120 may perform both the non-rigid calibration and the rigid calibration on each of the plurality of sets of k-space data, which may obtain more accurate corrected data, thereby further improving the accuracy of the obtained dynamic MR image sequence.

Example

For illustration purposes, a process for performing dynamic MRI on a liver of a subject is provided below. The ROI of the subject includes the liver of subject, and the physiological motion of the subject is the respiratory motion of the subject. Specifically, the processing device 120 may obtain a plurality of sets of k-space data of the ROI of the subject. The sets of k-space data may be collected by the MRI scanner 110 during an MR scan of the ROI after an MR sequence is applied on the subject. In some embodiments, the MR scan is divided into a plurality of acquisition periods, and each of the plurality of sets of k-space data may be collected by the MRI scanner 110 during one of a plurality of acquisition periods. More descriptions for obtaining of the plurality of sets of k-space data of the ROI may be found elsewhere in the present disclosure. See, e.g., operation 310 in FIG. 3 and relevant descriptions thereof.

Then, for each of the plurality of sets of k-space data, the processing device 120 may determine position information of a reference region during the corresponding acquisition period based on the set of k-space data. In some embodiments, the reference region may be an interface between a lung and the diaphragm, or an interface between the lung and the liver of the subject. More descriptions for the determination of the position information of the reference region may be found elsewhere in the present disclosure. See, e.g., operation 320 in FIG. 3 and relevant descriptions thereof.

Further, for each of the plurality of sets of k-space data, the processing device 120 may perform a rigid calibration of the set of k-space data based on the position information of the reference region to generate a plurality sets of corrected k-space data.

In some embodiments, the processing device 120 may correct navigator data and/or imaging data of a set of k-space data. For example, a motion direction of the respiratory motion of the subject may be a direction between the head and the feet of the subject. As describes in elsewhere of the present disclosure, the position information of the reference region may include position information along the motion direction of the physiological motion. Therefore, the position information of the reference region may include position information along the direction between the head and the feet of the subject. For example, the position information of the reference region may include a coordinate of the reference region (e.g., an average coordinate of points in the reference region) along the direction between the head and the feet of the subject in a preset coordinate system.

In some embodiments, the readout direction of the navigator data and the motion direction of the physiological motion may be parallel. The processing device 120 may determine first phase correction factors according to Equation (1), and correct the navigator data using the first phase correction factors according to Equation (2), wherein the $Z_0$ denotes a coordinate of a reference position along the direction between the head and the feet of the subject, $Z(t)$ denotes a coordinate of the reference region corresponding to the acquisition period along the direction between the head and the feet of the subject, $(Z(t)-Z_0)_1$ denotes a first motion component along the readout direction of the navigator data during the acquisition period. Since the readout direction of the navigator data and the motion direction of the physiological motion are parallel, a second motion component along a direction perpendicular to the readout direction of the navigator data during the acquisition period may be 0, and the navigator data only needs to be corrected using the first phase correction factors.

The readout direction of the imaging data and the motion direction of the physiological motion may be perpendicular. The processing device 120 may determine a second phase correction factor according to Equation (3), and correct the imaging data using the second phase correction factor according to Equation (4), wherein the $Z_0$ denotes the coordinate of the reference position along the direction between the head and the feet of the subject, $Z(t)$ denotes the coordinate of the reference region corresponding to the acquisition period along the direction between the head and the feet of the subject, $(Z(t)-Z_0)_2$ denotes a fourth motion component along a direction perpendicular to the readout direction of the imaging data during the acquisition period. Since the readout direction of the imaging data and the motion direction of the physiological motion are perpendicular, a third motion component along the readout direction of the imaging data during the acquisition period may be 0, and the imaging data only needs to be corrected using the second phase correction factor.

In some embodiments, the processing device 120 may generate a dynamic MR image sequence based on the plurality sets of corrected k-space data by performing operation 340.

In some embodiments, the processing device 120 may further perform a non-rigid calibration before or after the rigid calibration performed on the sets of corrected k-space data. More descriptions for the non-rigid calibration may be found elsewhere in the present disclosure (e.g., FIG. 6 and relevant descriptions thereof).

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

It will be apparent to those skilled in the art that various changes and modifications can be made in the present disclosure without departing from the spirit and scope of the disclosure. In this manner, the present disclosure may be intended to include such modifications and variations if the modifications and variations of the present disclosure are within the scope of the appended claims and the equivalents thereof.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an subject oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate a certain variation (e.g., ±1%, ±5%, ±10%, or ±20%) of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable. In some embodiments, a classification condition used in classification or determination is provided for illustration purposes and modified according to different situations. For example, a classification condition that "a value is greater than the threshold value" may further include or exclude a condition that "the probability value is equal to the threshold value."

What is claimed is:

1. A magnetic resonance imaging (MRI) system, comprising:
    at least one storage device including a set of instructions for dynamic MRI; and
    at least one processor in communication with the at least one storage device, wherein when executing the set of instructions, the at least one processor is configured to direct the system to perform operations including:
        obtaining a plurality of sets of k-space data of a region of interest (ROI) of a subject, wherein each of the plurality of sets of k-space data is collected during one of a plurality of acquisition periods after an MR sequence is applied on the subject;
        for each of the plurality of sets of k-space data,
            determining, based on the set of k-space data, position information of a reference region during the corresponding acquisition period; and
            correcting the set of k-space data based on the position information of the reference region; and
        generating a dynamic MR image sequence based on the plurality sets of corrected k-space data.

2. The system of claim 1, wherein the determining, based on the set of k-space data, position information of a reference region during the corresponding acquisition period includes:
    generating, based on the set of k-space data, an initial MR image of the ROI;
    segmenting, from the initial MR image, a first region and a second region, wherein the reference region is located between the first region and the second region; and
    determining, based on the first region and the second region, the position information of the reference region.

3. The system of claim 1, wherein the reference region is an interface between a lung and a diaphragm of the subject or an interface between the lung and a liver of the subject.

4. The system of claim 1, wherein the set of k-space data includes navigator data, and the correcting the set of k-space data based on the position information of the reference region includes:
    determining a motion direction of a physiological motion of the subject and a readout direction of the navigator data;
    determining a first angle between the motion direction of the physiological motion and the readout direction of the navigator data; and
    correcting the navigator data based on the position information of the reference region and the first angle.

5. The system of claim 4, wherein the correcting the navigator data based on the position information of the reference region and the first angle includes:
    determining, based on the first angle, a first motion component of the physiological motion in the readout direction of the navigator data and a second motion component of the physiological motion in a direction perpendicular to the readout direction of the navigator data; and
    correcting the navigator data based on the position information of the reference region, the first motion component, and the second motion component.

6. The system of claim 5, wherein when the first motion component is greater than 0, different points of the navigator data are corrected based on the first motion component using different first phase correction factors.

7. The system of claim 6, wherein the first phase correction factor of each point of the navigator data is determined based on a position of the point in k-space and the first motion component.

8. The system of claim 5, wherein when the second motion component is greater than 0, different points of the navigator data are corrected based on the second motion component using a same second phase correction factor.

9. The system of claim 8, wherein the second phase correction factor is determined based on the second motion component and information relating to a slab encoding direction of the navigator data.

10. The system of claim 1, wherein the set of k-space data includes imaging data, and the correcting the set of k-space data based on the position information of the reference region includes:
    determining a motion direction of a physiological motion of the subject and a readout direction of the imaging data;
    determining a second angle between the motion direction of the physiological motion and the readout direction of the imaging data; and
    correcting the imaging data based on the position information of the reference region and the second angle.

11. The system of claim 10, wherein the correcting the imaging data based on the position information of the reference region and the second angle includes:
    determining, based on the second angle, a third motion component of the physiological motion in the readout direction of the imaging data and a fourth motion component of the physiological motion in a direction perpendicular to the readout direction of the imaging data; and
    correcting the imaging data based on the position information of the reference region, the third motion component, and the fourth motion component.

12. The system of claim 1, wherein the generating a dynamic MR image sequence based on the plurality sets of corrected k-space data includes:
    dividing, based on the position information of the reference region corresponding to the plurality of acquisition periods, the plurality sets of corrected k-space data into a plurality of bins;
    generating an initial matrix including the plurality sets of corrected k-space data based on the plurality of bins and the plurality of acquisition periods;
    generating a completion matrix by completing the initial matrix; and
    generating, based on the completion matrix, the dynamic MR image sequence.

13. The system of claim 1, wherein the generating a dynamic MR image sequence based on the plurality sets of corrected k-space data includes:
    reconstructing a plurality of second initial MR images based on the plurality of sets of corrected k-space data;
    generating a plurality of registered MR images corresponding to the plurality of acquisition periods by performing image registration between the plurality of second initial MR images;
    for each of the plurality of acquisition periods, determining reference navigator data corresponding to the acquisition period based on the registered MR image corresponding to the acquisition period; and
    generating the dynamic MR image sequence based on the reference navigator data and the registered MR image of each acquisition period.

14. The system of claim 13, wherein for each of the plurality of acquisition periods, the corresponding set of k-space data includes navigator data, and the determining reference navigator data corresponding to the acquisition period based on the registered MR image corresponding to the acquisition period comprises:

for each of the plurality of acquisition periods,
determining, from the registered MR image of the acquisition period, a plurality of sectional images perpendicular to a readout direction of the navigator data corresponding to the acquisition period; and
determining the reference navigator data of the acquisition period based on the plurality of sectional images.

15. The system of claim 14, wherein the determining the reference navigator data of the acquisition period based on the plurality of sectional images comprises:

for each of the plurality of sectional images, determining a sum of pixel values of pixels in the sectional image; and
determining the reference navigator data based on the sum corresponding to each of the plurality of sectional images.

16. A magnetic resonance imaging (MRI) system, comprising:

at least one storage device including a set of instructions for dynamic MRI; and
at least one processor in communication with the at least one storage device, wherein when executing the set of instructions, the at least one processor is configured to direct the system to perform operations including:
obtaining a plurality of initial magnetic resonance (MR) images of a region of interest (ROI) of a subject, wherein each of the plurality of initial MR images is reconstructed based on a set of k-space data collected during one of a plurality of acquisition periods after an MR sequence is applied on the subject;
generating a plurality of registered MR images corresponding to the plurality of acquisition periods by performing image registration between the plurality of initial MR images;
for each of the plurality of acquisition periods, determining reference navigator data corresponding to the acquisition period based on the registered MR image corresponding to the acquisition period; and
generating a dynamic MR image sequence based on the reference navigator data and the registered MR image of each acquisition period.

17. The system of claim 16, wherein for each of the plurality of acquisition periods, the corresponding set of k-space data includes navigator data, and the determining reference navigator data corresponding to the acquisition period based on the registered MR image corresponding to the acquisition period comprises:

for each of the plurality of acquisition periods,
determining, from the registered MR image of the acquisition period, a plurality of sectional images perpendicular to a readout direction of the navigator data corresponding to the acquisition period; and
determining the reference navigator data of the acquisition period based on the plurality of sectional images.

18. The system of claim 17, wherein the determining the reference navigator data of the acquisition period based on the plurality of sectional images comprises:

for each of the plurality of sectional images, determining a sum of pixel values of pixels in the sectional image; and
determining the reference navigator data based on the sum corresponding to each of the plurality of sectional images.

19. A magnetic resonance imaging (MRI) method, implemented on a computing device having at least one processor and at least one storage device, the method comprising:

obtaining a plurality of sets of k-space data of a region of interest (ROI) of a subject, wherein each of the plurality of sets of k-space data is collected during one of a plurality of acquisition periods after an MR sequence is applied on the subject;
for each of the plurality of sets of k-space data,
determining, based on the set of k-space data, position information of a reference region during the corresponding acquisition period; and
correcting the set of k-space data based on the position information of the reference region; and
generating a dynamic MR image sequence based on the plurality sets of corrected k-space data.

20. The method of claim 19, wherein the set of k-space data includes navigator data, and the correcting the set of k-space data based on the position information of the reference region includes:

determining a motion direction of a physiological motion of the subject and a readout direction of the navigator data;
determining a first angle between the motion direction of the physiological motion and the readout direction of the navigator data; and
correcting the navigator data based on the position information of the reference region and the first angle.

* * * * *